United States Patent
Khalili et al.

(10) Patent No.: US 7,766,076 B2
(45) Date of Patent: Aug. 3, 2010

(54) SPOT COOLER FOR HEAT GENERATING ELECTRONIC COMPONENTS

(75) Inventors: Kaveh Khalili, Boulder City, NV (US); Uwe Rockenfeller, Boulder City, NV (US)

(73) Assignee: Rocky Research, Boulder City, NV (US)

( * ) Notice: Subject to any disclaimer, the term of this patent is extended or adjusted under 35 U.S.C. 154(b) by 65 days.

(21) Appl. No.: 11/690,748

(22) Filed: Mar. 23, 2007

(65) Prior Publication Data

US 2008/0230209 A1 Sep. 25, 2008

(51) Int. Cl.
F28F 7/02 (2006.01)
(52) U.S. Cl. .................. 165/104.33; 165/80.3; 165/121
(58) Field of Classification Search ................ 165/80.3, 165/104.21, 104.26, 104.33, 121; 361/697, 361/700, 703
See application file for complete search history.

(56) References Cited

U.S. PATENT DOCUMENTS

| | | | |
|---|---|---|---|
| 2,883,591 A | 4/1959 | Camp | |
| 5,019,880 A * | 5/1991 | Higgins, III | 257/714 |
| 5,216,580 A | 6/1993 | Davidson et al. | |
| 5,415,535 A | 5/1995 | Sato et al. | |
| 5,582,343 A | 12/1996 | Dalvey | |
| 5,597,034 A * | 1/1997 | Barker et al. | 165/80.3 |
| 6,196,300 B1 * | 3/2001 | Checchetti | 165/80.3 |
| 6,446,707 B1 * | 9/2002 | White | 165/80.3 |
| 6,552,902 B2 * | 4/2003 | Cho et al. | 361/704 |
| 6,588,498 B1 | 7/2003 | Reyzin et al. | |
| 6,657,865 B1 * | 12/2003 | Tseng et al. | 361/709 |
| 6,691,768 B2 * | 2/2004 | Hsieh et al. | 165/80.3 |
| 6,945,318 B2 * | 9/2005 | Ma et al. | 165/104.33 |
| 7,063,130 B2 * | 6/2006 | Huang | 165/121 |
| 7,163,050 B2 * | 1/2007 | Wang et al. | 165/104.33 |
| 7,269,011 B2 * | 9/2007 | Bhatti et al. | 361/699 |
| 7,333,336 B2 * | 2/2008 | Kim | 361/709 |
| 2004/0011508 A1 * | 1/2004 | Tan et al. | 165/80.3 |
| 2004/0011511 A1 | 1/2004 | Ghosh et al. | |
| 2005/0231916 A1 * | 10/2005 | Bahl et al. | 361/700 |

* cited by examiner

OTHER PUBLICATIONS

"Gigabyte 3D Rocket Cooler PCU22-SE Heatsink Review," printed Jun. 21, 2007 at http://www.frostytech.com/articleview.cfm?articleID=1686, (Nov. 22, 2004).

Primary Examiner—Teresa J Walberg
(74) Attorney, Agent, or Firm—Knobbe, Martens, Olson & Bear LLP

(57) ABSTRACT

A cooler for heat generating electronic components comprising a heat exchange plate configured for heat exchange communication with one or more heat generating electronic components includes a fin stack having a plurality of heat exchange fins and one or more heat pipes and/or thermosyphon tubes in heat exchange communication with the heat exchange plate and said plurality of fins, and a fan for directing air to and/or from the fins, each of said fins having a centered interior circular opening or hole, the fins stacked with the holes coaxially aligned and substantially centered in the fin stack and defining an elongated cavity having a first open end adjacent to the heat exchange plate and a second open end adjacent to the fan, and an elongated insert centrally positioned lengthwise along the cylindrical cavity and having a exterior surface of revolution smaller than the diameter of the cavity and defining an airflow channel between the insert and the fin openings and wherein the exterior surface of revolution of the insert is shaped, tapered or slanted and/or the interior openings of the fins are of the same or different diameters to provide an airflow channel width increasing from the fist end to the second end.

31 Claims, 4 Drawing Sheets

SPOT COOLER FOR HEAT GENERATING ELECTRONIC COMPONENTS

BACKGROUND

As the capacity and performance of electronic components such as microprocessors increases, so does the need for developing more efficient cooling devices capable of rapidly dissipating heat from these heat generating components in order to maintain their operational efficiency. Various designs of cooling devices for directing and dissipating heat from heat generating electronic components have been proposed. A heat sink using vertically stacked fins combined with a heat pipe is described in U.S. Pat. No. 5,415,535. Recently, a CPU cooler marketed by Gigabyte Technology Co. Ltd. as 3D Rocket Cooler incorporates vertically stacked fins and integrated heat pipes with a central open cavity and a fan for directing air through the cavity and between the fins.

SUMMARY

The apparatus described herein comprises a cooling device for directing heat from one or more heat generating electronic components comprising a stack of heat exchange fins or plates and a plurality of heat pipes and/or thermosyphon tubes secured in heat exchange communication with the fins. The apparatus is characterized by an interior cavity extending centrally and vertically through the fin stack, and an elongated core or insert centrally positioned lengthwise along the cavity. Each of the fins is provided with a circular cutout, hole or opening and the fins are stacked with the circular inner edges aligned to form and define the cavity. The diameter of the core or insert is smaller than the diameter of the circular opening of an adjacent fin whereby the core and cavity cooperate to define and provide an airflow channel formed between the core surface and the inner edges of the fins. The apparatus includes a heat exchange plate configured for heat exchange communication with one or more heat generating electronic components and the heat pipes and/or thermosyphon tubes are in heat exchange communication with the heat exchange plate and the fins. A preferred apparatus also includes a fan positioned at the top, opposite the heat exchange plate for directing air to and/or from the cavity space between the surface of the elongated core or insert and the interior edges of the fins. In a preferred embodiment, the interior cavity is substantially cylindrical and the core is conical or ellipsoidal and secured with the smaller and positioned at the top of the cavity, opposite the heat exchange plate and adjacent to the fan. In other embodiments the interior cavity is tapered along its length and maybe used with cores of different shapes and designs as will be described hereinafter. Other features and characteristics will be described in the following detailed description.

DETAILED DESCRIPTION

Figure 1:
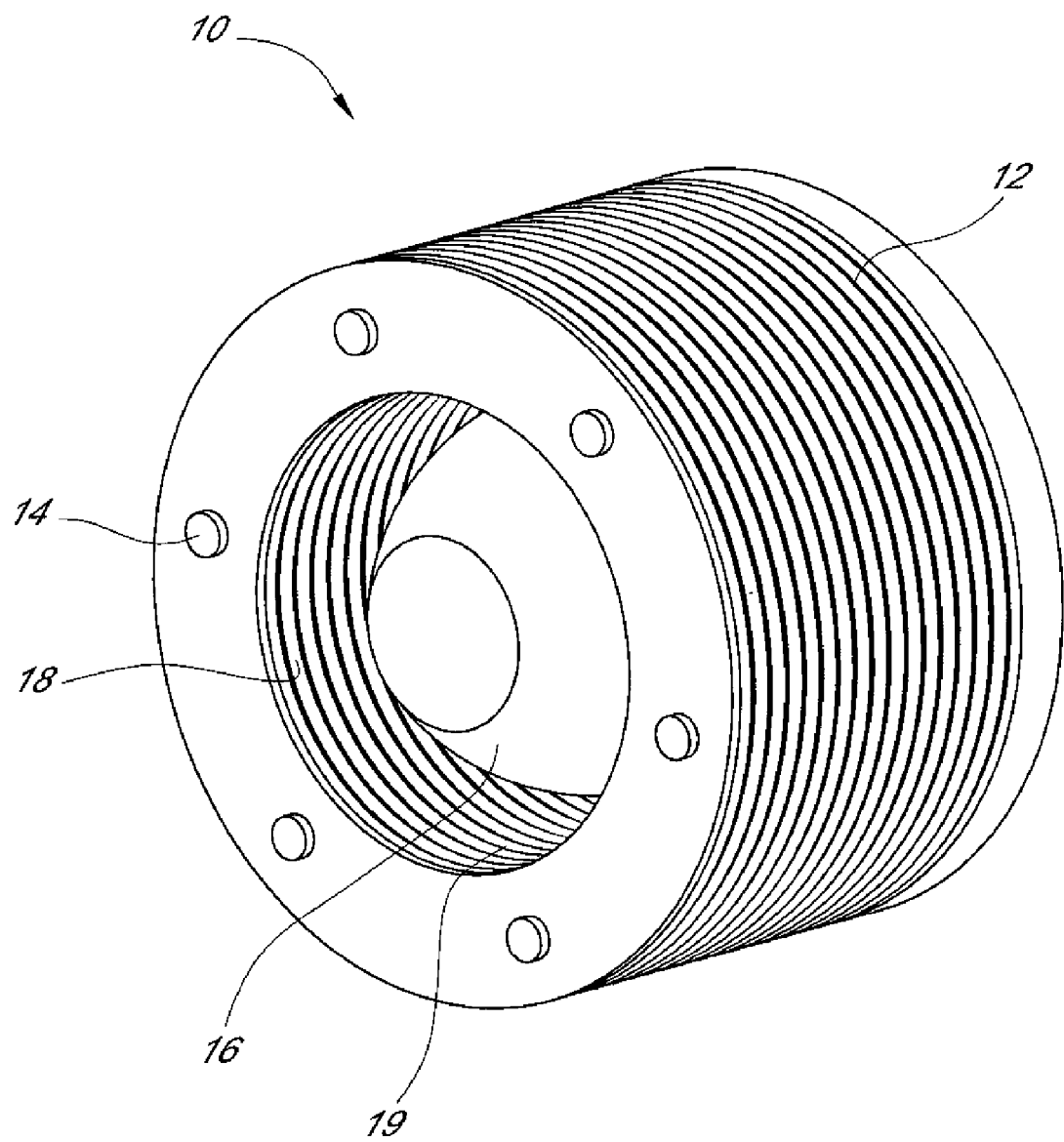
FIG. 1 is a perspective view of a portion of the cooling apparatus showing an open end of the fin stack, cylindrical cavity and elongated core insert.
Figure 2:
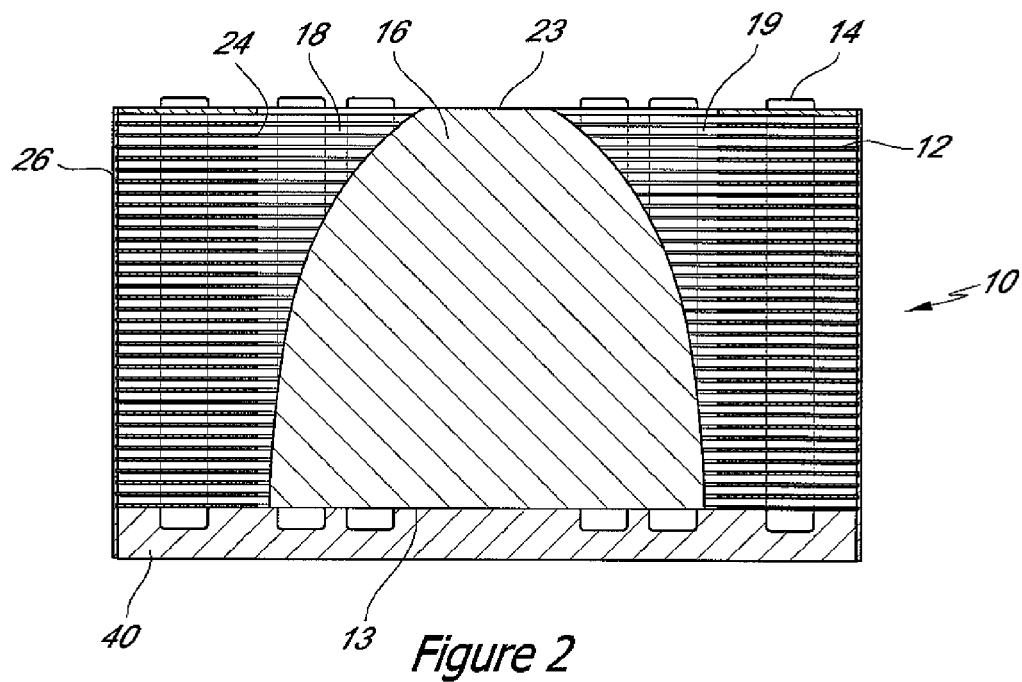
FIG. 2 is a side sectional elevation of the apparatus of FIG. 1.

FIGS. 1 and 2 illustrate an assembly 10 comprising a stack of round, thin planar fins 12 in the center of which is an enlarged central interior space or cavity 18. The cavity 18 is defined by the circular internal edges 24 of the fins which are aligned to define a cylindrical cavity. Positioned and secured within the cylindrical cavity is an insert or core 16. The outer surface of the core is tapered and comprises a surface of revolution spaced from the inner edges of the heat exchange fins to form an airflow channel 19. The insert is centrally positioned and secured within the cylindrical cavity to provide a uniform, efficient airflow. For efficient airflow and cooling, the width of the airflow channel, the distance between the core surface and the adjacent inner fin edge measured along the plane of the fin, is between about 0.05 and about 1.5 inch. Preferably, the width of the channel is between about 0.75 inch and about 1.25 inch.

Figure 3:
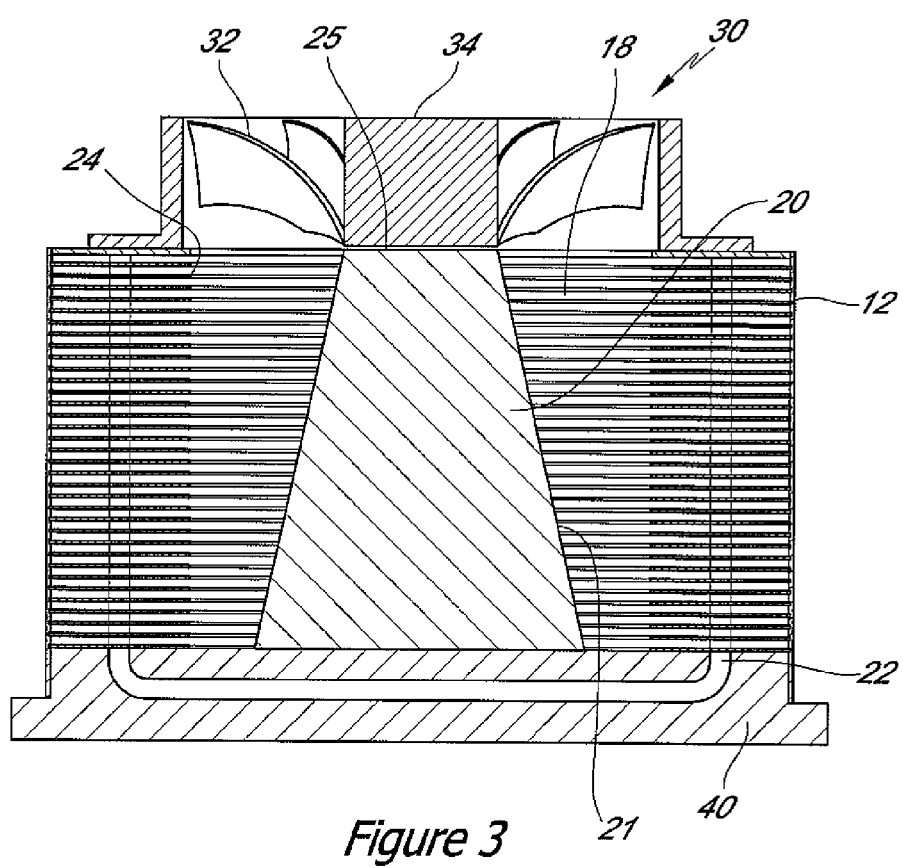
FIG. 3 is a side sectional elevation illustrating another embodiment including a fan and frustoconical insert or core.
Figure 4:
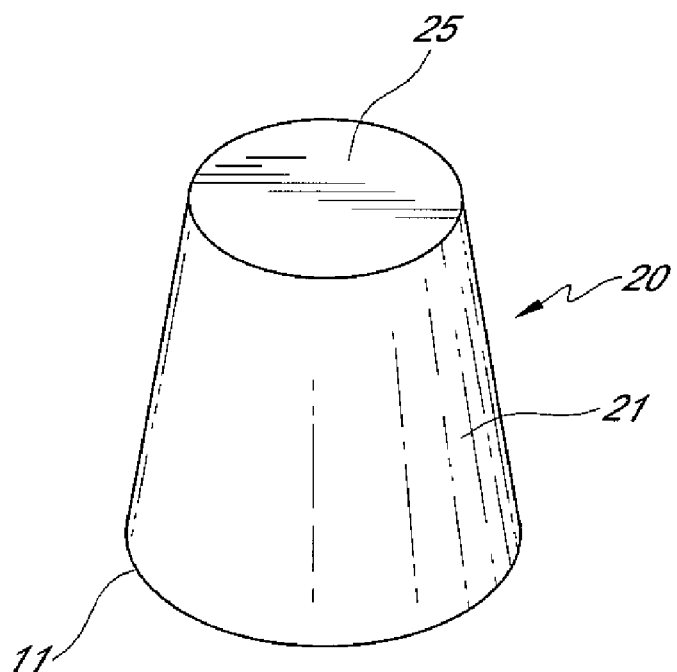
FIGS. 4 and 5 illustrate conical and arched (ellipsoidal) core designs, respectively.
Figure 5:
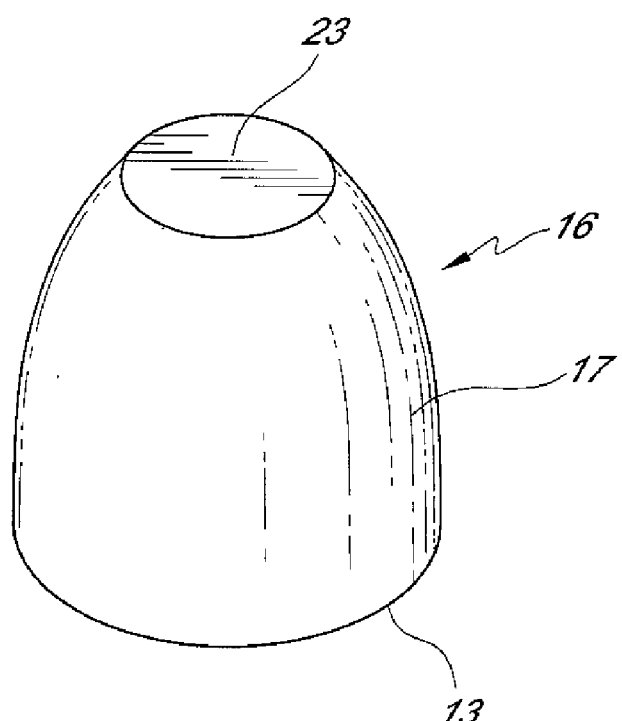

The shape of the exterior surface of revolution of the insert or core may be a substantially uniform taper between the upper and lower ends of the core, such as a conical frustum whereby the angle of the slope is substantially the same from top to bottom of the insert, or it may be asymmetrical or ellipsoidal, for example, curved or arched between the top and the bottom of the insert. The surfaces of revolution of the ellipsoidal inserts illustrated in FIGS. 1, 2 and 5 are curved or arched along their length, whereas those illustrated in FIGS. 3 and 4 are conical frustums. An asymmetrical ellipsoidal or arched insert or core has a circular cross-section in any plane normal to its central axis as does a frustoconical insert. A core may be solid or hollow and made of any suitable material. For example, metals, plastics, wood, paper or other cellulosic products, ceramics, plaster or other materials may be used depending on cost, weight and other considerations know to those skilled in the art.

The cooling apparatus includes a plurality of heat pipes and/or thermosyphon pipes or tubes, preferably extending substantially perpendicular or normal to the plane of the stacked fins, with the outer surface of the heat pipes in heat exchange communication with the fins. A plurality of such heat pipes 14 are illustrated in FIGS. 1 and 2 and thermosyphon tubes 22 in FIG. 3. Such heat pipes and thermosyphon tubes are well known to those skilled in the art and are provided with a refrigerant capable of evaporating and condensing. Suitable refrigerants include water, ammonia, alcohols, alcohol/water mixtures and other liquid-gas refrigerants known to those skilled in the art. Water may be preferred because of its low pressure and relatively high heat transfer characteristics, particularly useful in rejecting heat from a microprocessor to ambient temperatures of between about 20° C. and about 50° C. The heat pipe design also preferably includes internal wicking material such as sintered copper and the like, known to those skilled in the art. The thermosyphon tubes and/or heat pipes may be expanded to the circular fins hydraulically or using other methods known to those skilled in the art. The material of the fins is preferably aluminum, because of its relative light weight, although copper or other metals or alloys may be used.

Another component of the assembly includes a heat transfer plate 40 shown in FIGS. 2 and 3 secured in heat exchange communication with the evaporative end or section of the heat pipes or thermosyphon tubes. The heat transfer plate is also configured for heat exchange communication with one or more heat generating devices, e.g., one or more microprocessors, computer chips, etc. Such a configuration may include cavities, notches, or other shapes or configurations for engaging and/or nesting or receiving a portion or a surface of such a heat generating device, or with an intermediate layer or component which transfers heat from the heat generating device to the heat transfer plate.

FIGS. 4 and 5 illustrate examples of different shapes suitable for an insert or core. In FIG. 4, a frustoconical insert 20 has a symmetrical surface of revolution 21 extending between the larger end 11 and smaller end 25 of the insert. In FIGS. 2 and 5, the insert 16 is asymmetrical or arched along its exterior surface of revolution 17 between the larger surface 13 and the smaller end 23 of the insert. Again, where the insert is not a cone or a conical frustum, but is arched or curved along its length, such arch or curve may be substantially uniform between the ends of the insert or nonuniform, as long as the exterior surface of revolution itself is circular around its perimeter in any plane normal to the axis of the insert. A preferred insert is a conical frustum which has been found to be more efficient in dissipating heat uniformly in the apparatus as described.

Another component of the assembly is a fan mounted or positioned at the end of the fin stack opposite from the heat transfer plate. Observing FIG. 3, a fan 30 is mounted opposite the heat transfer plate 40. The fan includes blades 32 with the fan core 34 positioned directly opposite the upper end 25 of insert 20. The fan blades are also preferably positioned so that the area of the fan blade is directly over and coincides with the outer and inner diameter of the upper end of the cylindrical cavity 18 as illustrated in FIG. 3. Such an arrangement will provide for uniform airflow along the space of the cavity from top to bottom as the air is directed along the exterior surface of revolution of the insert 20 and the inner edges of the fins as well as between the spacing of the stacked fins. A second fan may also be used, positioned at the opposite end of the fin stack and interior cavity from the top fan, and adjacent to the heat transfer plate. If the two fans are uneven in power, the stronger fan is preferably positioned at the top of the cooler.

As illustrated in FIGS. 1-3, the fins are flat and planar and in the preferred shape of annular discs which are stacked vertically along the heat pipes and/or thermosyphon tubes. The fins are also preferably evenly spaced apart along the fin stack, as illustrated. The specific distance between plates will depend on the desired airflow, number of fins, fin stack height, fan power, and heat generated by the electronic component to be cooled. Typical and suitable fin separation is between about 4 fins/inch and about 8 fins/inch. The specific thickness or cross-section of the core or insert as well as the diameter of the cylindrical space created by the interior fin edges and the specific distance between the surface of the insert and the interior fin edges will also depend on the airflow characteristics desired and the aforesaid mentioned priorities to be met. Advantageous design characteristics of such a cooler include simplicity of geometry, low weight, and high heat transfer characteristics, preferably 0.15° C. per watt or less, for rejecting, for example, 80 watts to 100 watts of heat to an ambient temperature as high as about 50° C. while keeping a microprocessor at or below about 66° C.

Figure 6:
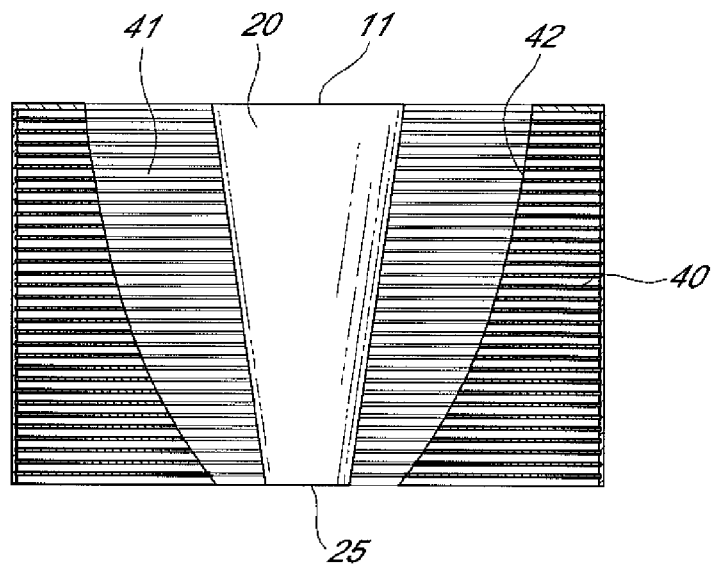
FIGS. 6, 7 and 8 illustrate other embodiments having shaped or contoured cavities used with alternative core designs.
Figure 7:
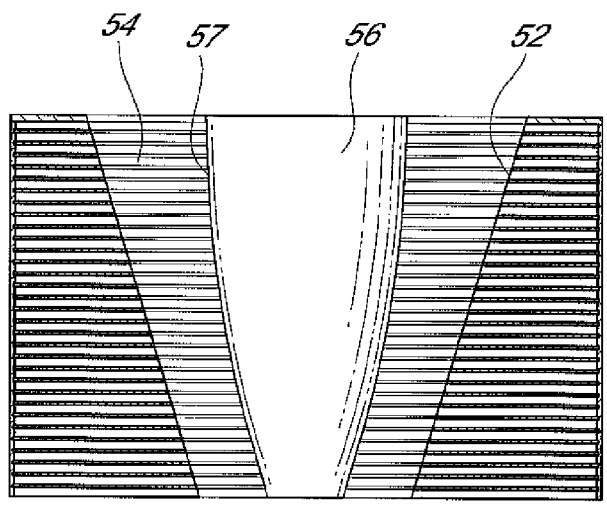
Figure 8:
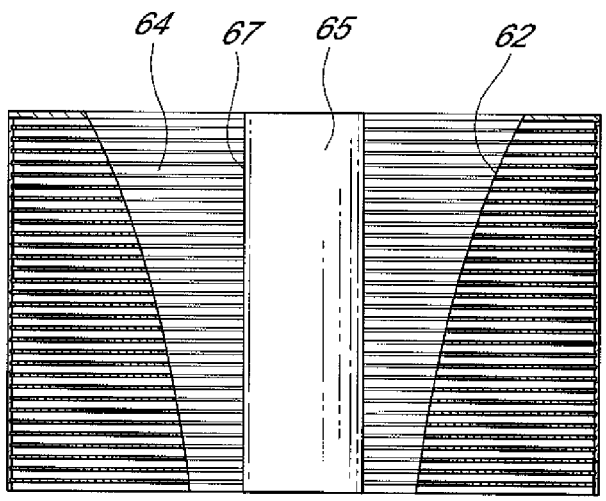

FIGS. 6-8 illustrate other interior cavity and insert embodiments. In FIG. 6 the edges of the fins in fan stack 40 form a concave shape 42 along the side of channel 44 with a frustoconical insert 20 centered in the channel. The insert shown is shaped like insert 20 illustrated in FIGS. 3 and 4 but is inverted with smaller diameter end 25 positioned adjacent to the bottom of the cavity, near the heat exchange plate (not shown) and the upper larger end 11 positioned adjacent to the fan (not shown). At least a portion of the circular inner fin edges forming the cavity have different diameters, with diameter dimensions increasing from the bottom or lowest fin upwardly toward the top of the fin stack. Preferably, the space between the inner fin edges and the insert, i.e., the width of the air flow channel, also increases from the bottom of the cavity to the top. The slope or angle of the side of the conical insert and the arch of the side of the conical insert and the arch or contour of the channel defined by the inner edges of the stacked fins is not limited so long as efficient airflow is provided and preferably within channel width dimensions as previously stated.

FIG. 7 illustrates another alternative embodiment with arched or ellipsoidal cone 56 inverted from orientations shown in FIGS. 1, 2 and 5 centered in cavity 54 having a generally straight or linear slanted side 52 defined by inner fin opening diameters increasing from bottom to top and providing an enlarging air flow channel from bottom to top. Again, insert contour shapes and dimensions and specific cavity slope angles are not critical so long as efficient air flow is provided within previously stated preferred dimensions.

FIG. 8 illustrates another embodiment having a contoured cavity and airflow channel increasing from bottom to top using a cylindrical insert 65 centered with cavity 64. The diameters of the inner fin edges 62 cooperate to form a generally coned shaped side 62 along cavity 64 and provide an enlarging airflow channel from bottom to top.

The different and alternative shapes, contours and designs of the inserts and cavities illustrated and described herein are examples of those components for providing improved performance of the spot coolers and are not intended to be exhaustive of other variations and combinations evident to those skilled in the art.

What is claimed is:

1. An apparatus for directing heat from a heat generating device comprising:

a heat transfer plate configured for heat exchange communication with a heat generating device at a lower end;

a fin stack comprising a plurality of flat substantially parallel heat exchange fins each having a central interior circular space defined by a substantially circular inner edge, said heat exchange fins stacked vertically with the center of their respective interior circular spaces aligned along a common axis and defining a vertical cavity and spaced apart to form a first airflow channel therebetween;

a plurality of heat pipes and/or thermosyphon tubes secured in heat exchange communication with said heat transfer plate and said plurality of heat exchange fins;

an elongated insert secured lengthwise along the center of said vertical cavity and extending from an upper end to the lower end thereof and having an exterior surface of revolution spaced from the circular inner edges of the heat exchange fins and forming a second airflow channel therebetween, said second airflow channel narrowing from top to bottom and communicating with said first airflow channel;

a fan positioned at the top of said fin stack comprising a fan core mounted directly opposite and adjacent to the upper end of said elongated insert, and opposite said heat transfer plate, said fan configured such that the fan blades extend from the fan core whereby the fan blade area substantially coincides with the outer and inner diameter of the upper end of the cylindrical cavity for directing air along said first and second airflow channels without substantial deflection by the upper end of said elongated insert; and wherein said fan directs air through said first airflow channels via said second airflow channel for cooling said heat exchange fins and said heat pipes and/or said thermosyphon tubes.

2. An apparatus of claim 1 wherein said elongated insert has a tapered, slanted or contoured exterior surface of revolution.

3. An apparatus of claim 2 wherein said side of said vertical cavity is cylindrical.

4. An apparatus of claim 3 wherein said elongated insert is secured in said cavity with its wide end adjacent to said heat transfer plate.

5. An apparatus of claim 3 wherein the exterior surface of said elongated insert is curved or arched along at least a portion of its length.

6. An apparatus of claim 4 wherein the exterior surface of said elongated insert is conical.

7. An apparatus of claim 4 wherein the exterior surface of said elongated insert is frustoconical.

8. An apparatus of claim 6 or 7 wherein said airflow channel is between about 0.05 inch and about 1.5 inch.

9. An apparatus of claim 6 or 7 wherein said airflow channel is between about 0.75 inch and about 1.25 inch.

10. An apparatus of claim 1 wherein said side of said vertical cavity is cylindrical.

11. An apparatus of claim 1 wherein said elongated insert is cylindrical and wherein the side of said vertical cavity is tapered, slanted or contoured.

12. An apparatus of claim 1, 2, 3, 10 or 11 wherein said airflow channel is between about 0.05 inch and about 1.5 inch.

13. An apparatus of claim 1, 2, 3, 10 or 11 wherein said airflow channel is between about 0.75 inch and about 1.25 inch.

14. An apparatus of claim 1 wherein said heat transfer plate is generally planar and wherein said heat pipes and/or thermosyphon tubes extend generally normal to the plane of said heat transfer plate.

15. An apparatus of claim 1 wherein said heat exchange fins are substantially planar and stacked with respective planes substantially parallel to one another and evenly spaced apart.

16. An apparatus of claim 1 wherein said heat exchange fins are substantially planar and stacked with respective planes substantially parallel to one another and to the plane of said heat transfer plate.

17. An apparatus of claim 1 wherein said heat transfer fins are substantially circular.

18. An apparatus of claim 1 wherein the tapered surface of revolution of said elongated insert and the circular inner edges of said heat exchange fins cooperate to define a symmetrical tapered airflow channel therebetween.

19. An apparatus of claim 1 wherein the elongated insert is positioned in said cylindrical cavity with its greatest diameter adjacent to said heat transfer plate and its smallest diameter at an opposite end thereof.

20. An apparatus of claim 19 wherein the exterior surface of said elongated insert is curved or arched along at least a portion of its length.

21. An apparatus of claim 19 wherein the exterior surface of said elongated insert is conical.

22. An apparatus of claim 19 wherein the exterior surface of said elongated insert is frustoconical.

23. An apparatus of claim 18, 19, 20, 21 or 22 wherein said airflow channel is between about 0.05 inch and about 1.5 inch.

24. An apparatus of claim 18, 19, 20, 21 or 22 wherein said airflow channel is between about 0.75 inch and about 1.25 inch.

25. A cooler for heat generating electronic components comprising:
a heat exchange plate configured for heat exchange communication with one or more heat generating electronic components, a fin stack comprising a plurality of vertically substantially horizontally stacked heat exchange fins spaced apart to form a plurality of first airflow channels therebetween, and one or more heat pipes and/or thermosyphon tubes in heat exchange communication with said heat exchange plate and said plurality of fins, each of said fins characterized by a circular hole, each hole of substantially the same diameter, said fins stacked with the hole centers coaxially aligned and substantially centered in said fin stack and defining an elongated vertical cavity having a first open end adjacent to a fan and a second open end adjacent to said heat exchange plate, and an elongated insert centrally positioned lengthwise from the top to the bottom of said vertical cavity and having a tapered exterior surface of revolution and cooperating with said fins to form a tapered second airflow channel communicating with said first airflow channels, and a fan mounted on the upper end of said fin stack and adjacent to the top of said elongated insert for directing air through said first and said second airflow channels, and wherein said fan comprises a fan core mounted directly opposite to the top of said elongated insert and comprises fan blades extending from said fan core, whereby the fan blade area substantially coincides with the outer and inner diameter of the first open end of said elongated vertical cavity and whereby airflow through said cavity is directed along the exterior surface of said elongated insert without substantial deflection by the top of said elongated insert.

26. The cooler of claim 25 wherein said tapered second airflow channel narrows from the top to the bottom of said cavity.

27. The cooler of claim 25 comprising an airflow channel between the exterior surface of said elongated insert and said cylindrical cavity having a width of between about 0.05 inch and about 1.5 inch therealong.

28. The cooler of claim 25 comprising an airflow channel between the exterior surface of said elongated insert and said cylindrical cavity having a width of between about 0.75 inch and about 1.25 inch therealong.

29. A heat exchanger for cooling one or more heat generating devices comprising:
a heat exchange plate configured for heat exchange communication with one or more heat generating devices;
a fin stack comprising a plurality of substantially flat, planar, separated and parallel heat exchange fins each said fin having a substantially circular hole therein, said fins stacked vertically with the respective center of the circular holes aligned along a common axis extending substantially normal to the plane of said fins, said holes defining an elongated cylindrical cavity having a first end adjacent to a fan and an opposite, second end adjacent to said heat exchange plate;
a plurality of heat pipes and/or thermosyphon tubes secured in heat exchange communication with said heat exchange fins and said heat exchange plate;
an insert comprising a tapered surface of revolution positioned substantially coaxially within said cylindrical cavity and extending the length thereof with its greatest diameter at a first end thereof adjacent to said heat exchange plate at a first end of said cavity and its smallest diameter at a second end adjacent to a fan at a second end of said cavity, wherein the greatest insert diameter is less than the diameter of said cylindrical cavity and wherein said surface of revolution cooperates with said cylindrical cavity to define a tapered airflow channel therealong; and a fan mounted at a top of said fin stack for directing a flow of air into said cavity, said fan having a fan core mounted directly opposite and adjacent to the second end of said insert, said fan configured such that the fan blades extend from the fan core whereby the fan blade area substantially coincides with the outer and inner diameter of the said first end of said cylindrical cavity and whereby the airflow through said cavity is directed along the exterior surface of said insert without substantial deflection at said second end thereof.

30. A heat exchanger of claim 29 wherein said airflow channel is between about 0.05 inch and about 1.5 inch wide.

31. A heat exchanger of claim 29 wherein said airflow channel is between about 0.75 inch and about 1.25 inch wide.

* * * * *